United States Patent
Gigliotti, Jr. et al.

(10) Patent No.: US 6,343,641 B1
(45) Date of Patent: Feb. 5, 2002

(54) CONTROLLING CASTING GRAIN SPACING

(75) Inventors: Michael Francis Xavier Gigliotti, Jr., Scotia; Shyh-Chin Huang, Latham; Roger John Petterson, Fultonville; Lee Cranford Perocchi, Schenectady, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/422,179

(22) Filed: Oct. 22, 1999

(51) Int. Cl.[7] .......................... B22D 27/00; B22D 27/04
(52) U.S. Cl. ..................... 164/122.1; 164/126; 164/128
(58) Field of Search .............................. 164/122, 122.1, 164/122.2, 126, 127; 29/889, 722

(56) References Cited

U.S. PATENT DOCUMENTS

| | | | |
|---|---|---|---|
| 3,763,926 A | * 10/1973 | Tschinkel et al. | 164/338 |
| 3,955,616 A | 5/1976 | Gigliotti, Jr. et al. | 164/361 |
| 3,972,367 A | 8/1976 | Gigliotti, Jr. et al. | 164/72 |
| 4,031,945 A | 6/1977 | Gigliotti, Jr. et al. | 164/72 |
| 4,108,236 A | 8/1978 | Salkeld | 164/338 |
| 4,202,400 A | 5/1980 | Gigliotti, Jr. et al. | 164/251 |
| 4,213,497 A | 7/1980 | Sawyer | 164/60 |
| 4,289,570 A | * 9/1981 | Terkelsen | 164/122.1 |
| 4,292,076 A | 9/1981 | Gigliotti et al. | 75/170 |
| 4,475,582 A | * 10/1984 | Giamei et al. | 164/122.2 |
| 4,589,937 A | 5/1986 | Jackson et al. | 148/404 |
| 4,804,311 A | 2/1989 | Anderson et al. | 415/191 |
| 4,813,470 A | 3/1989 | Chiang | 164/122.1 |
| 5,071,054 A | 12/1991 | Dzugan et al. | 228/119 |
| 5,445,688 A | 8/1995 | Gigliotti, Jr. et al. | 148/527 |
| 5,540,790 A | 7/1996 | Erickson | 148/410 |
| 5,858,558 A | 1/1999 | Zhao et al. | 428/680 |
| 6,213,192 B1 | * 4/2001 | Smashey | 164/122.1 |

FOREIGN PATENT DOCUMENTS

| | | |
|---|---|---|
| EP | 059549 B1 | 9/1982 |
| EP | 126550 A1 | 11/1984 |

OTHER PUBLICATIONS

Japanese Patent Abstract, Derwent Publications Ltd., London, —1995–020454.
European Search Report.

* cited by examiner

*Primary Examiner*—M. Alexandra Elve
*Assistant Examiner*—Kevin McHenry
(74) *Attorney, Agent, or Firm*—Paul J. DiConza; Donald S. Ingraham

(57) ABSTRACT

A grain starter capable of nucleating a multiplicity of grains in a casting is positioned within a mold. The mold is filled with molten metal and a solidification interface is caused to pass from the grain starter through the molten metal by immersing the mold in a cooling bath to form a casting that has a multiplicity of grains nucleated by the grain starter.

28 Claims, 2 Drawing Sheets

Solidification Direction

▓ Fine-grained Seed

◐ <100> Oriented Off-Axis

⊜ <100> Oriented Along Solidification Direction

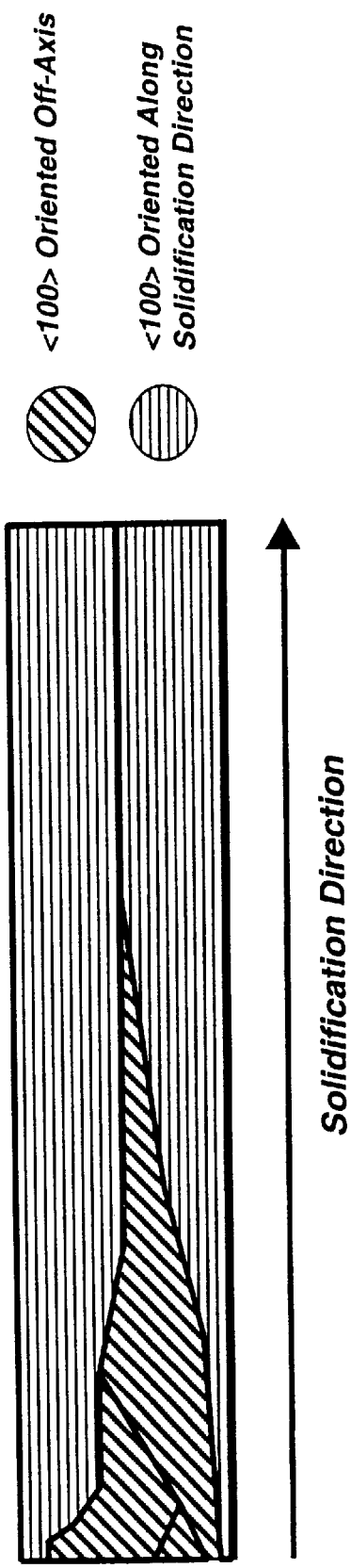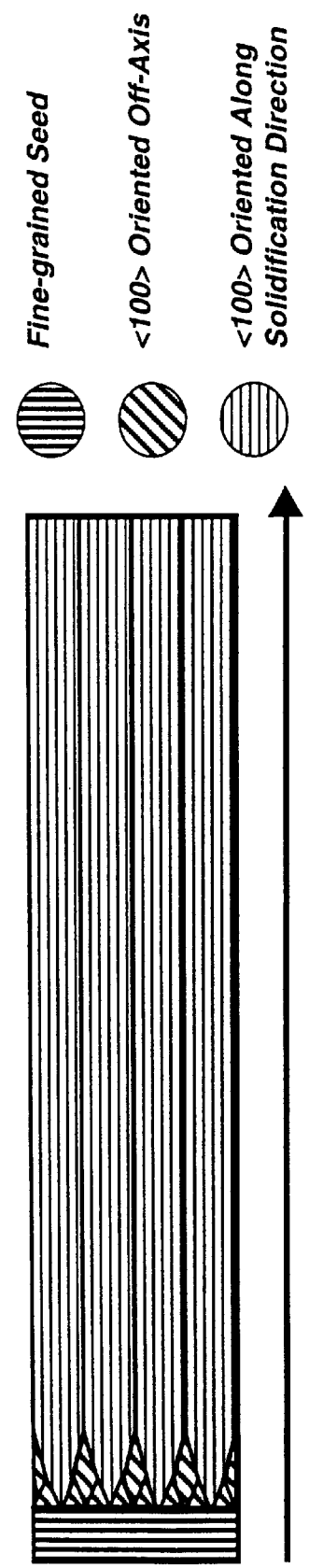

CONTROLLING CASTING GRAIN SPACING

BACKGROUND OF THE INVENTION

The invention relates to a method for controlling grain spacing of a columnar superalloy casting.

A superalloy includes nickel, cobalt, nickel-iron or iron-based heat resistant alloys that have superior strength and oxidation resistance at high temperatures. The superalloy can contain chromium to impart surface stability and one or more minor constituents, such as molybdenum, tungsten, columbium, titanium or aluminum, for strengthening purposes. The physical properties of a superalloy make it particularly useful for the manufacture of a gas turbine component.

A grain is an individual crystal in a polycrystalline solid. A grain boundary is an interface between individual crystals. The crystal grain characteristics of a superalloy can determine superalloy properties. For example, the strength of a superalloy is determined in part by grain spacing. At low temperatures, grain boundaries impede dislocation motion. Hence, fine grain equal axial structures are preferred for low temperature applications. At high temperatures, deformation processes are diffusion controlled. Diffusion along grain boundaries is much higher than within the grains. Hence, large-grain spacing structures can be stronger than fine grain structures in high temperature applications. Generally, failure originates at grain boundaries oriented perpendicular to the direction of an induced stress. By casting a superalloy to produce an elongated columnar structure with unidirectional crystals aligned substantially parallel to the long axis of the casting, the number of grain boundaries normal to the primary stress axis can be minimized.

Directional solidification is a method that is used for producing turbine blades and the like with columnar crystalline structures. Generally, a crystalline growth structure is created at the base of a vertically disposed mold defining a part and a solidification front is propagated through the structure under the influence of a moving thermal gradient. During directional solidification, crystals of nickel, cobalt or iron-based superalloys are characterized by a "dendritic" morphology. Dendritic refers to a form of crystal growth where forming solid extends into still molten liquid as an array of fine-branched needles. Spacing between the needles in the solidification direction is called "primary dendrite arm spacing." Spacing of side branches or arms along a needle's length is termed "secondary dendrite arm spacing." Both primary and secondary dendrite arm spacing are functions of cooling rate. Cooling rate is the product of solidification rate and thermal gradient at a solid liquid interface.

Solidification rate kinetics vary with crystallographic orientation. For a fixed driving force, the solidification rate in nickel based superalloys is typically highest in the crystallographic unit cell edge direction (<100> direction).

One desired macrostructure of a directionally solidified superalloy consists of grains elongated along the direction of solidification so that grain boundaries are aligned in the solidification direction. It is further desired that the crystallographic unit cell edge direction <100> of the grains be parallel to the solidification direction to provide improved mechanical properties. If two grains are growing side-by-side into a temperature gradient, the grain with growth axis closest to a <100> direction grows faster. The faster growing grain also spreads laterally. Lateral spread of a grain occurs by growth of secondary arms. If two grains are growing side by side into a liquid, and one grain leads the other by secondary arm spacing, the leading grain will extend a secondary arm in front to pinch off the lagging grain. This phenomenon is termed "competitive growth." Until competitive growth achieves a structure of only grains close to the <100> direction, the grain boundaries will not be parallel and along the axis of the cast part. The section of a casting where the grains are competing to establish parallel growth is unusable as a turbine part and must be discarded.

A need exists for a directional solidification process that can produce columnar castings characterized by prescribed grain spacings. Additionally, a need exists for a directional solidification process that provides an increased proportion of casting characterized by aligned parallel axis oriented crystals.

SUMMARY OF THE INVENTION

The invention relates to a method of controlling grain spacing of a casting and to the product of the method. In the method, a grain starter that is capable of nucleating a multiplicity of grains, is positioned within a mold. The mold is filled with molten metal and a solidification interface is caused to pass from the grain starter through the molten metal by immersing the mold in a cooling bath to form a casting that has a multiplicity of grains nucleated by the grain starter.

In an embodiment, a grain spacing is determined for a columnar article. A grain starter is selected that has a grain spacing determined to provide the grain spacing in the article when the article is cast in a liquid metal cooled directional solidification process. The grain starter is positioned in a mold and the mold is filled with molten metal. A solidification interface is caused to pass from the grain starter through the molten metal by immersing the mold in a liquid metal cooling bath to form an article having a grain spacing determined by the grain starter spacing.

In still another embodiment, the invention relates to a method of producing a cast article with a substantially increased proportion of parallel axis grain structure. The method comprises making a fine grain superalloy multicrystalline grain starter capable of nucleating a multiplicity of grains in a solidifying casting. The grain starter is provided within a mold and the mold is filled with molten metal. A solidification interface is then caused to pass from the grain starter through the solidifying casting by immersing the mold in a cooling bath to form a casting that has a multiplicity of grains nucleated by the grain starter.

BRIEF DESCRIPTION OF THE DRAWINGS

FIG. 1 is a schematic representation of a microstructure with heterogeneous grain nucleation;

FIG. 2 is a schematic representation of a microstructure growth from a fine-grain grain starter.

DETAILED DESCRIPTION OF THE INVENTION

Figure 3:
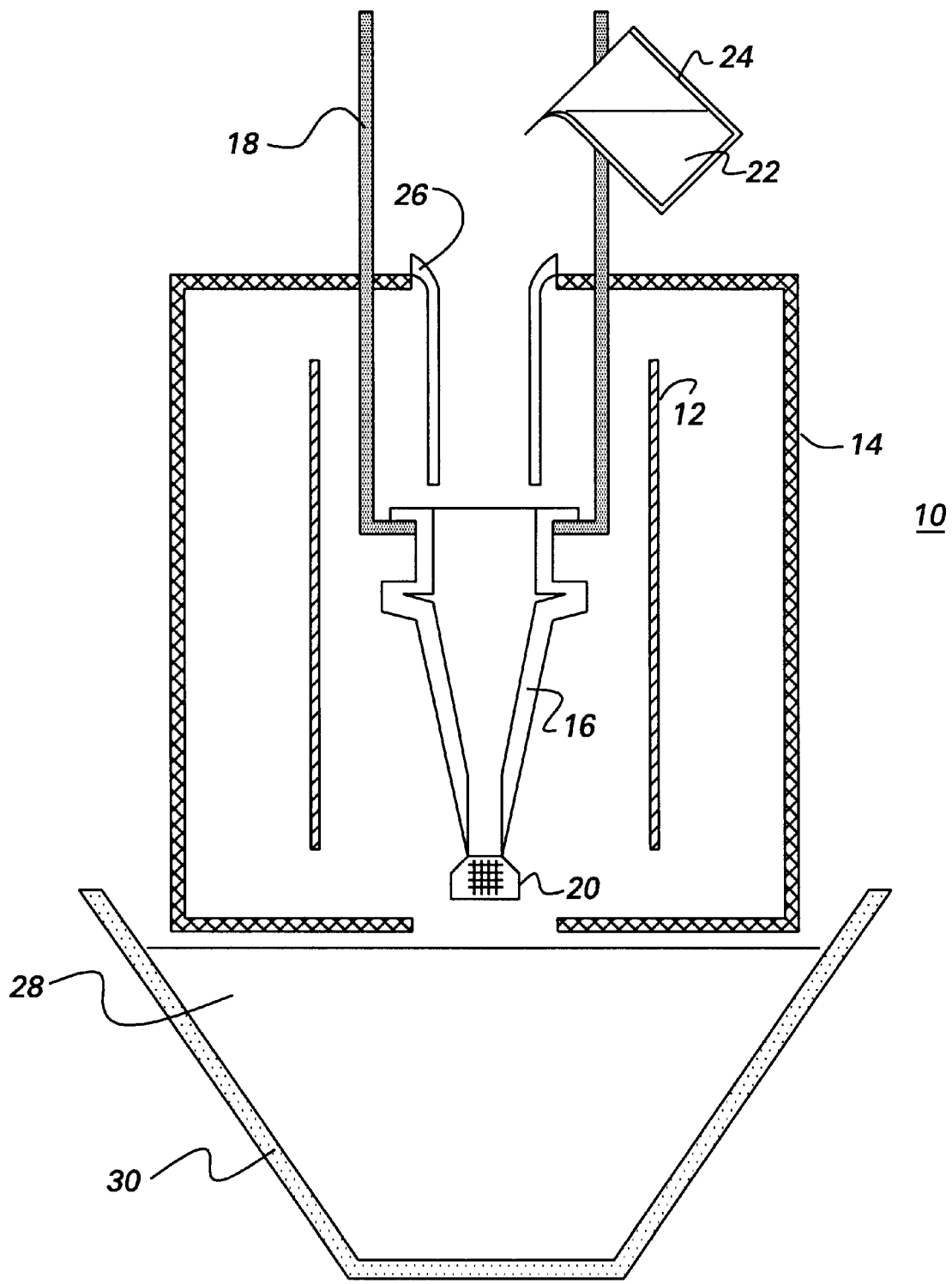
FIG. 3 is a schematic sectional view of a furnace for conducting a directional solidification process.

According to the invention, A grain starter, as embodied by the invention, is characterized by many, fine grains. The grain starter is used at the base of a directionally solidified casting to assure emergence of <100> grains. The grain starter nucleates fine grains of all orientations. In all locations, there will be some grains with <100> orientation. The <100> grains, by competitive growth, pinch off the other orientations.

FIG. 1 illustrates a casting produced by a liquid metal cooling process without use of the grain starter of the present invention. In FIG. 1, the superalloy casting is made by pouring liquid metal into a mold or melting metal in situ. A moving temperature profile is generated along the casting, for example by lowering the mold out of a furnace. At the beginning of the solidification process, a few solid crystals nucleate from the liquid metal in the coldest region of the mold. These crystals are typically of random orientation. As directional solidification progresses, the grains with nearest <100> orientation pinch off the other grains. This competitive growth process can result in misoriented grains that persist along the casting for considerable distance. The casting may be deemed of poor quality and not useful for some applications.

A grain starter, as embodied by the invention, is illustrated in FIG. 2. The grain starter has fine, randomly oriented grains. Randomly oriented grains result in crystalline growth characterized by many grains. In all regions, there will be a few grains with <100> orientation. These <100> grains are well-oriented grains that quickly pinch off growth of other grains. A spacing of grain for the grain starter is less than the dendrite arm spacing of the casting. This permits <100> oriented grains to establish first dendrite side arms that quickly pinch off growth of other grains.

The grain starter comprises a metal casting agent that is capable of nucleating fine grains in a superalloy. The grain starter has a multiple crystalline structure comprising at least a multiplicity of grains. The grain starter can be characterized by a grain spacing at least greater than about 10 $\mu$m. Grain spacing of the grain starter can be chosen to be less than the anticipated dendritic arm spacing of the developing crystals. While dendritic arm spacing is a function of cooling rate, typically, the dendrite arm spacing is from about 100 $\mu$m up to about 500 $\mu$m. The grain spacing of the grain starter can be chosen to be less than about 500 $\mu$m, desirably less than about 200 $\mu$m, such as less than about 100 $\mu$m.

The required fine grain starters can be made by densification of at least one of a metal powder, a wrought metal, and a ceramic that is an efficient nucleating agent for fine grains. In one process, the grain starter is made by mechanically working a bar of superalloy metal having a cast coarse grain size. The superalloy metal is plastically deformed, then annealed, or otherwise heat treated, to recrystallize the metal structure with a fine randomly oriented grain structure.

In another process as embodied by the invention, the superalloy can be mechanically worked, machined, or otherwise compounded at a low temperature, and then heat treated to recrystallize the metal to a final desired grain size.

In further process, as embodied by the invention, a superalloy grain starter of undetermined grain structure is mechanically deformed and then placed in a directional solidification furnace mold. The grain starter is used in an "as-worked" condition.

The grain starter can comprise nickel, chromium, or iron based superalloys. Examples of such grain starters include Hastelloy X, René 80, IN 738, Ni—20Cr—10Ti alloy, GTD-111, GTD-222, René 41, René 125, René 77, René 95, René 80, Inconel 706, Inconel 718, Inconel 625, cobalt-based HS188, cobalt-based L-605 and stainless steels. Ceramic nucleating agents for fine grains in superalloys include, but are not limited to, cobalt oxide and cobalt aluminate.

The use of a grain starter is advantageous for castings made by a liquid metal cooling process. In a directional solidification process, a mold is placed on a chill plate. Grains nucleate in a cold region as liquid metal is poured into the mold. In the liquid metal cooling process, the mold is lowered into a liquid metal for cooling. The mold is above the cooling bath at the beginning of solidification. The grain starter can be used to assure proper grain nucleation as the metal cools.

FIG. 3 illustrates a schematic sectional view of a furnace 10 for a directional solidification process, as embodied by the invention. In FIG. 3, the directional solidification furnace 10 is heated, for example, by resistance heated graphite strips 12 within insulated furnace box 14. A ceramic shell mold 16 is suspended in the furnace 10 by a mold positioner 18. A grain starter 20 is disposed within the mold 16.

A superalloy 22 is melted in crucible 24 and poured through a basin 26 into the mold 16. Randomly oriented solid superalloy grains then nucleate on the grain starter 20. Mold 16 is then lowered into a liquid cooling metal 28 in a container 30 at a prescribed lowering rate. A solid-liquid interface advances upward in the liquid metal away from the cooling metal 28 as heat is carried away from the liquid metal by the cooling metal 28. An ingot is formed after the mold 16 is withdrawn from the furnace 10 and immersed into the cooling metal 28.

These and other features will become apparent from the following examples. The examples are not intended to limit the invention in any way.

In the following examples, cylindrical castings were made in a Bridgman furnace using aluminum-based molds. In each example, the furnace casting temperature is about 1550° C. and withdrawal rate is about 12 inches/hour, and all dimensions and measurements are approximate. Grain starters of sintered cobalt aluminate and of hot pressed nickel alloy René 80 are used as grain starters for nickel alloy GTD-111 castings. The initial René 80 powder size is less than 500 $\mu$m. In a conventional Bridgman furnace, the casting is lowered from the furnace and is cooled by radiation. In the following examples, the furnace mold was provided with a cooling plate to simulate cooling by a cooling bath such as a liquid metal bath. The composition of the nickel alloy René 80 in weight percent is: Ni with 9.5 Co, 14 Cr. 4.0 Mo, 4.0 W, 3.0 Al, 5.0 Ti, 0.17 C, 0.015 B and 0.03 Zr. The composition of the nickel alloy GTD-111 in weight percent is: Ni, 9.5 C0, 14 Cr, 1.6 Mo, 3.8 W, 3.0 Al, 4.9 Ti, 2.8 Ta, 0.10 C, 0.12 B and 0.04 Zr.

EXAMPLE 1

A 7/8" diameter casting of GTD-111 is grown in an aluminum oxide mold. The casting is sectioned longitudinally and etched with acid to reveal the casting grain structure. Grain boundaries at angles greater than about 20° to the growth direction were observed for 2" above the base of the casting.

EXAMPLE 2

A casting is made in a manner similar to Example 1, except that a grain starter of hot pressed René 80 powder is placed at the bottom of the casting mold. The grain size of the pressed René 80 is less than 500 $\mu$m. The resulting casting exhibits a region of very fine grains, less than 1/16" in diameter for a ½" length of the casting. Above this region of fine grains, the grain structure is columnar, with boundaries oriented less than 20° to the growth direction. The structure above the region of fine grains is useable. The region of acceptable casting represents an increase in yield beyond the yield of Example 1.

EXAMPLE 3

A casting is made in a manner similar to that of Example 1, except that a grain starter of sintered cobalt aluminate ($CoAl_2O_4$) is placed at the bottom of the casting. This grain starter has ⅛" inch deep grooves machined on its surface to increase contact area of the grain starter with superalloy. A ½' region at the base of the casting exhibits equiaxed grains. Above the region, columnar structure is present beginning at less than ½" from the casting bottom. The useable casting extends beyond the ½" length. The region of acceptable casting represents a substantial increase in yield beyond Example 1.

While embodiments of the invention have been described, the present invention is capable of variation and modification, and therefore should not be limited to the precise details of the examples. The invention includes changes and alterations that fall within the purview of the following claims.

What is claimed:

1. A method of controlling transverse grain size of a casting, the method comprising:
    positioning a grain starter capable of nucleating a multiplicity of grains in a solidifying casting within a mold, said grain starter comprising a transverse grain size less than a desired dendrite arm spacing of the solidifying casting;
    filling the mold with molten metal; and
    passing a solidification interface from the grain starter through the solidifying casting by immersing the mold in a cooling bath to form a casting that comprises a multiplicity of grains that are nucleated by the grain starter.

2. The method of claim 1, wherein the grain starter comprises a transverse grain size less than about 500 µm.

3. The method of claim 1, wherein the grain starter comprises a transverse grain size less than about 200 µm.

4. The method of claim 1, wherein the grain starter comprises a transverse grain size less than about 100 µm.

5. The method of claim 1, wherein the grain starter comprises a transverse grain size at least greater than about 10 µm.

6. The method of claim 1, wherein the grain starter comprises a transverse grain size in a range between about 500 µm and about 10 µm.

7. The method of claim 1, wherein the cooling bath comprises a liquid metal cooling bath.

8. The method of claim 1, wherein the grain starter comprises a metal casting agent capable of nucleating fine grains in a superalloy.

9. The method of claim 1, wherein the grain starter comprises densifying metal powder.

10. The method of claim 1, wherein the grain starter at least one of mechanically worked and heat treated wrought metal or ceramic.

11. The method of claim 1, wherein the grain starter comprises nickel, chromium, iron based superalloy.

12. The method of claim 1, wherein the casting comprises a superalloy and the grain starter comprises cobalt oxide or cobalt aluminate.

13. The method of claim 1, wherein the grain starter comprises GTD-111 or René 80.

14. The method of claim 1, wherein the casting comprises a superalloy and the grain starter comprises the same superalloy as the casting.

15. The method of claim 1, wherein the casting comprises a gas turbine blade.

16. A casting formed by the process of claim 1.

17. The casting of claim 16, wherein by a region of grains less than 1/16" in diameter extends less than 2 inches above a base of the product.

18. The casting of claim 16, wherein by a region of grains less than 1/16" in diameter extends no more than a ½" length.

19. The casting of claim 16, wherein by a region of grains less than 1/16" in diameter extends less than 2 inches above a base of the product and a columnar grain structure with boundaries less than 20° to the growth direction above the region of grains.

20. A liquid metal cooled directional solidification method to form an article with a columnar grain structure, the method comprising:
    determining a transverse grain size for a columnar article;
    selecting a grain starter comprising a transverse grain size that:
        A) is less than a desired dendrite arm spacing of the solidifying casting, and:
        B is sufficient to provide the transverse grain size in the article when the article is cast by the liquid metal cooled directional solidification process;
    disposing the grain starter in a mold;
    filling the mold with molten metal; and
    passing a solidification interface from the grain starter through the molten metal by immersing the mold in the liquid metal cooling bath to form the article having a columnar-grained structure determined by the grain starter transverse grain size.

21. A method of casting a columnar-grained article, the method comprising:
    determining a transverse grain size for a columnar-grained article;
    providing a mold filled with molten metal and a grain starter, said grain starter comprising a transverse grain size that:
        A) is less than a desired dendrite arm spacing of the solidifying casting, and:
        B) is sufficient to provide the determined transverse grain size in the article when the article is cast; and
    moving a solidification interface along an axis of the mold by immersing the mold into a liquid metal cooling medium to provide the columnar-grained article with <100> grains substantially along the length of the columnar-grained article.

22. A method of producing a cast article with a parallel axis grain structure, the method comprising:
    determining a transverse grain size for an article with a parallel axis grain structure;
    making a fine-grain superalloy multicrystalline grain starter capable of nucleating a multiplicity of grains in a solidifying casting, said grain starter comprising a transverse grain size that:

A) is less than a desired dendrite arm spacing of the solidifying casting, and:

B) is sufficient to provide the determined transverse grain size in the article when the article is cast;

providing the grain starter within a mold;

filling the mold with molten metal; and passing a solidification interface from the grain starter through the solidifying casting by immersing the mold in a cooling bath to form a cast article with a parallel axis grain structure comprising a multiplicity of grains nucleated by the grain starter.

23. The method of claim 22, wherein the step of making the starter comprises:

densifying a metal powder to form a structure having a coarse grain size;

heat treating the structure to refine grain size within with randomly oriented multiple grains: and providing the structure as the grain starter.

24. The method of claim 22, wherein the step of making the starter comprises:

at least one of mechanically working, machining, and compounding one of a metal and ceramic to form a structure having deformed grains; and heating the structure to a temperature sufficient to recrystallize the structure to randomly oriented multiple grains.

25. The method of claim 22, wherein the step of making the starter comprises:

at least one of mechanically working, machining or compounding a metal or ceramic to form a starter having deformed grains.

26. The method of claim 22, wherein the fine grain superalloy multicrystalline grain starter comprises a nickel, chromium or iron based superalloy.

27. The method of claim 22, wherein the fine grain superalloy multicrystalline grain starter comprises GTD-111 or René 80.

28. The method of claim 22, wherein the casting comprises a superalloy and the grain starter comprises the same superalloy as the casting.

* * * * *